(12) United States Patent
Smith et al.

(10) Patent No.: US 8,385,064 B1
(45) Date of Patent: Feb. 26, 2013

(54) REVERSIBLE FAN MODULE FOR ELECTRONIC ENCLOSURES

(75) Inventors: Brian C. Smith, Madison, AL (US); Jacob D. McCleary, Harvest, AL (US)

(73) Assignee: Adtran, Inc., Huntsville, AL (US)

( * ) Notice: Subject to any disclaimer, the term of this patent is extended or adjusted under 35 U.S.C. 154(b) by 272 days.

(21) Appl. No.: 12/961,574

(22) Filed: Dec. 7, 2010

(51) Int. Cl.
*H05K 7/20* (2006.01)

(52) U.S. Cl. ............... 361/695; 361/679.48; 361/690; 361/694; 454/184

(58) Field of Classification Search .................. None
See application file for complete search history.

(56) References Cited

U.S. PATENT DOCUMENTS

| | | | |
|---|---|---|---|
| 6,735,081 B1 | 5/2004 | Bishop et al. | 361/695 |
| 6,817,889 B2 * | 11/2004 | Chang et al. | 439/485 |
| 7,023,877 B1 | 4/2006 | Blackburn et al. | 370/465 |
| 7,054,155 B1 * | 5/2006 | Mease et al. | 361/695 |
| 7,481,704 B2 * | 1/2009 | Kao et al. | 454/184 |
| 7,907,404 B2 * | 3/2011 | Wu et al. | 361/695 |
| 8,246,301 B2 * | 8/2012 | Li | 415/213.1 |
| 2005/0237714 A1 | 10/2005 | Ebermann | 361/695 |
| 2009/0021911 A1 * | 1/2009 | Lee et al. | 361/695 |

* cited by examiner

*Primary Examiner* — Boris Chervinsky
(74) *Attorney, Agent, or Firm* — Allen, Dyer, Doppelt, Milbrath & Gilchrist, P.A.

(57) ABSTRACT

An enclosure for electronics includes a chassis and an interface connector positioned within the chassis and configured to provide power. A fan shelf module is received within the chassis and has at least one fan to provide air flow through the chassis. The fan shelf module includes a pinout connector along a horizontal or vertical line of symmetry and configured to engage the interface connector and receive power therefrom, such that the fan shelf module is selectively installed in one of two opposing directions allowing a fan air flow direction to the chassis to be selected as either pulling air or pushing air through the chassis depending on the installed direction of the fan shelf module.

28 Claims, 6 Drawing Sheets

REVERSIBLE FAN MODULE FOR ELECTRONIC ENCLOSURES

FIELD OF THE INVENTION

This invention relates to electronic enclosures, and more particularly, this invention relates to heat management of electronic enclosures.

BACKGROUND OF THE INVENTION

Many pizza box type enclosures include a removable fan shelf module that provides air flow and cooling to electronic components within the enclosure, such as mounted in various compartments or shelves. This pizza box type enclosure is also referred to as a pizza box form factor because it is a style of computer case that typically is very thin, for example, a one-rack unit or two-rack unit (1U or 2U) and typically about 1¾ or 3.5 inches in height, making them wide and flat, thus, looking like pizza delivery boxes. Pizza box type enclosures are often used in data centers because of the stackability of that type of system, where servers must be periodically added or enlarged with various components. Some of these systems using this type of pizza box type enclosure include higher end Ethernet switches for mounting at the top of racks. Typically, these pizza box type enclosures include a chassis and have electronic components installed and mounted in different orientations. For example, sometimes an electronic component or other unit is installed both horizontally and vertically.

In a horizontal unit, there is no real benefit in blowing the air from the right to the left or the left to the right unless there is an obstacle impeding the air flow in one direction or an air heating element located on one side or the other. For a vertically mounted unit, natural convection provides air flow upward in a vertical direction. It is possible, however, that the preferred installation direction is opposite to this natural flow because of cable routing considerations or other factors. For example, one service provider created this type of problem in a remote enclosure installation using the Total Access 1248V as manufactured by ADTRAN, INC. In that installation, the cooling fans are directing the air flow downward. Other installations for outdoor remote enclosures have been known to be vertically oriented and have fans that blow in a direction opposing the air flow of the pizza box enclosure. In these cases, the air flow and thus the cooling are dramatically reduced due to the fans flowing in opposing directions. This reduces the air flow velocity in the box, resulting in overheating of components.

SUMMARY OF THE INVENTION

An enclosure for electronics includes a chassis and an interface connector positioned within the chassis and configured to provide power. A fan shelf module is received within the chassis and has at least one fan to provide air flow through the chassis. The fan shelf module includes a pinout connector along a horizontal or vertical line of symmetry and configured to engage the interface connector and receive power therefrom, such that the fan shelf module is selectively installed in one of two opposing directions allowing a fan air flow direction to the chassis to be selected as either pulling air or pushing air through the chassis depending on the installed direction of the fan shelf module.

In one example, the chassis includes a one rack unit height and the fan shelf module includes a plurality of serially mounted fans. The pinout connector includes a planar configured tab having electrical terminals that are symmetrically arranged on top and bottom allowing the pinout connector to be received within the interface connector in either opposing directions and permitting power to be drawn therefrom.

In another example, the symmetrically arranged electrical terminals are formed as dual ground and power terminals. In another example, a plurality of electronic shelf modules are received within the enclosure and arranged to receive the air flow created by the fan shelf module. The electronic shelf modules include vertical partition panels or members spaced parallel from each other and each configured to receive and support electronic modules. The enclosure is substantially rectangular configured in another example and includes side and end walls and receives the fan shelf module at one end wall. The plurality of electronic shelf modules are received in parallel to each other and to the fan shelf module. The enclosure includes a pizza box type enclosure in another example.

In one example, the chassis includes a fixed module frame near the end wall and includes a receiving slot and a guide edge. The fan shelf module includes a fan shelf tab and support track. The fan shelf module is installed within a first direction by sliding the fan shelf tab within the receiving slot and providing air flow in a first direction or installing the fan shelf module within a second opposing direction by reversing orientation of the fan shelf module and sliding the support track over the guide edge and providing air flow in a reverse direction.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein.

Rather, these embodiments are provided so that this disclosure will be thorough and complete, and will fully convey the scope to those skilled in the art.

FIGS. 1-10 show embodiments of an enclosure for electronics that solves the above-identified technical problem in which a fan shelf module is used with an enclosure for electronics such as a pizza box enclosure and can be installed in two different orientations to reverse the air flow. The fan shelf module as explained in greater detail below includes a symmetrical pinout connector that is oriented along a horizontal or vertical line of symmetry. It is possible to have the fan shelf module installed in two opposing directions. This allows the customer/installer to select the fan air flow direction that will provide the best cooling for the unit. This symmetrical pinout connector is typically placed along the vertical or horizontal line of symmetry for the fan shelf module and allows proper alignment with a mating connector when reversed.

Figure 1:
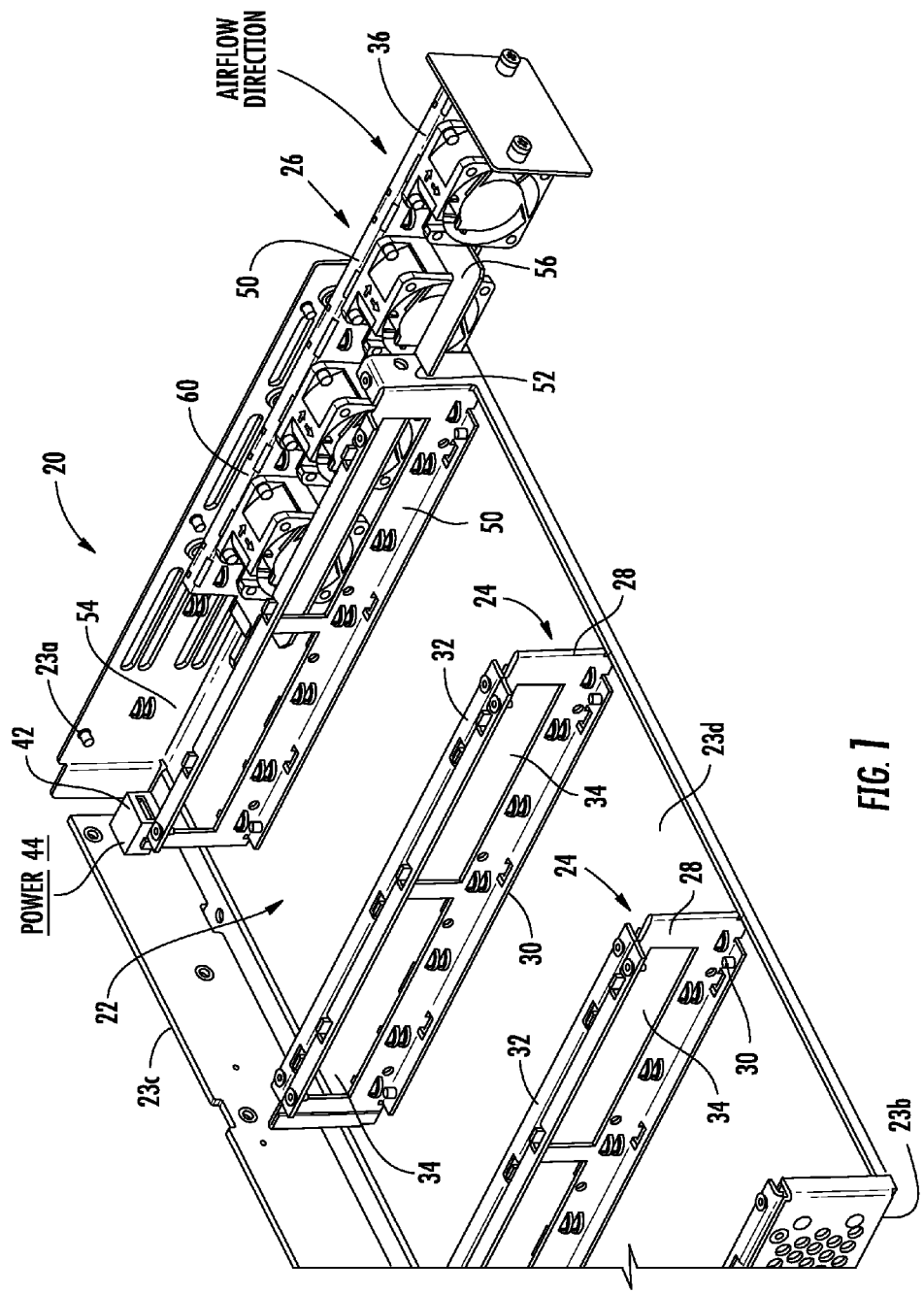
FIG. 1 is a fragmentary, perspective view of an enclosure for electronics having the fan shelf module received in a first direction for pushing air through the enclosure in accordance with a non-limiting example.

FIG. 1 shows a fragmentary drawing of an example enclosure 20 for electronics that includes a chassis 22 that is typically formed as a pizza box type form factor or enclosure and in this example is a one-rack unit height. In this example, one side wall and top cover is removed, showing only two opposing end walls 23a, 23b, a side wall 23c and bottom 23d. A plurality of electronic shelf modules 24 are received within the chassis 22 of the enclosure 20 typically hold electronic components and are arranged to receive air flow created by the fan shelf module, illustrated generally at 26. The electronic shelf modules 24 in this example are formed as vertical partition members that are spaced parallel from each other and each configured to receive and support electronic modules. In this example, the enclosure 20 is substantially rectangular configured, and at one end wall 23a, the fan shelf module is positioned as illustrated. The electronic shelf modules 24 are received in parallel to each other and to the fan shelf module 26.

As illustrated, the electronic shelf modules are formed as vertical partition members, for example, a rectangular configured partition panel 28 that includes a bottom support 30 that engages against the bottom wall 23d of the enclosure 20 and a top fixture support 32 that engages a top cover, which is received over the enclosure. Rivets or other fastening members can be used to secure the partition panels to the bottom wall of the enclosure and any top cover of the enclosure. Each partition panel includes two rectangular configured openings 34 that receive an electronic component such as an electronic shelf unit or other electronic module in an example. The rectangular openings 34 also allow air flow to pass through the enclosure and not be retarded by any partition panels 28. Although a one-rack unit height for the enclosure is illustrated, the enclosure could be a two-rack unit height or greater height and involve different enclosure configurations besides the illustrated rectangular configuration.

Figure 2:
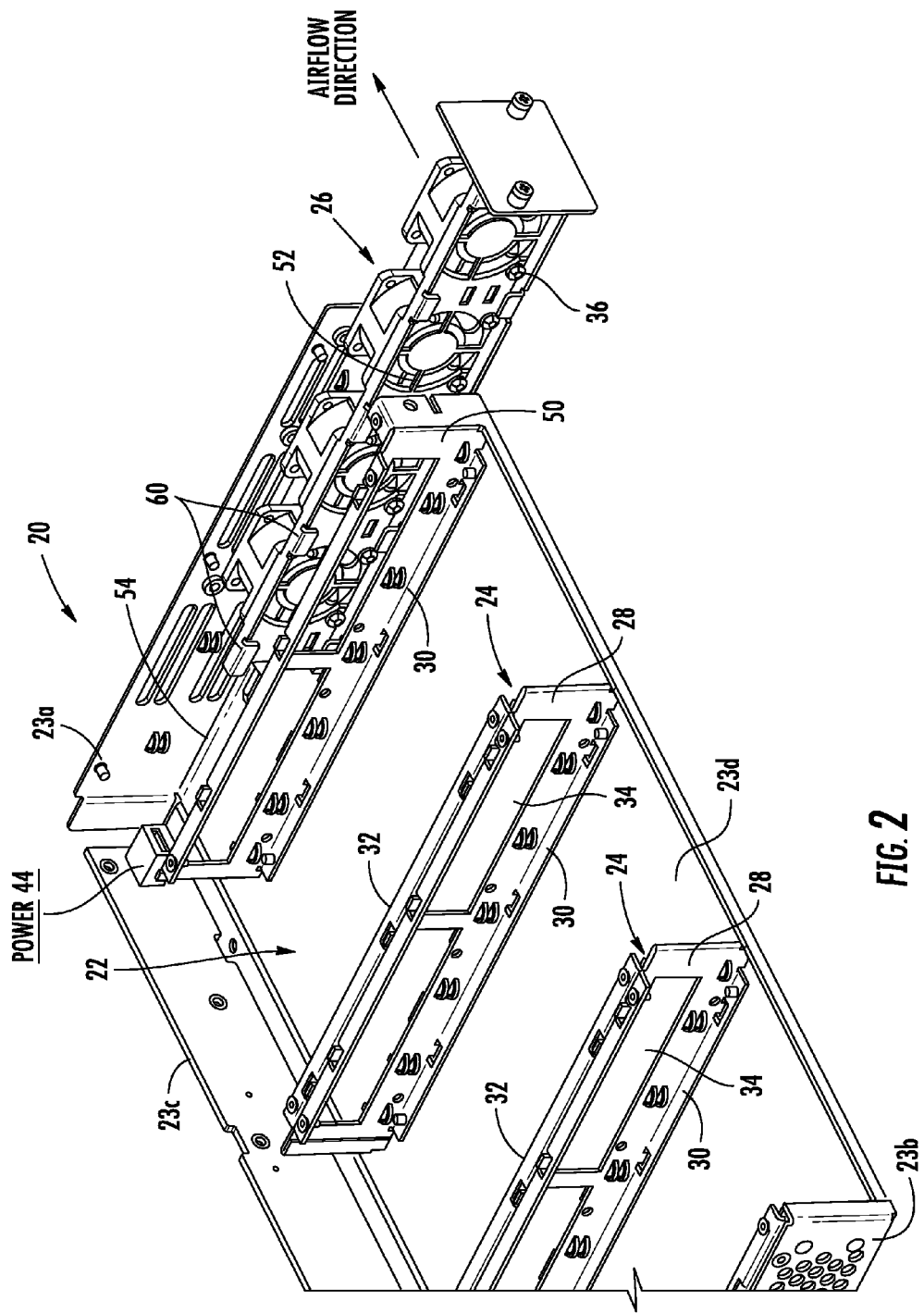
FIG. 2 is another fragmentary, perspective view similar to FIG. 1, but showing the fan shelf module selectively installed in an opposing direction as that shown in FIG. 1 in accordance with a non-limiting example.
Figure 3:
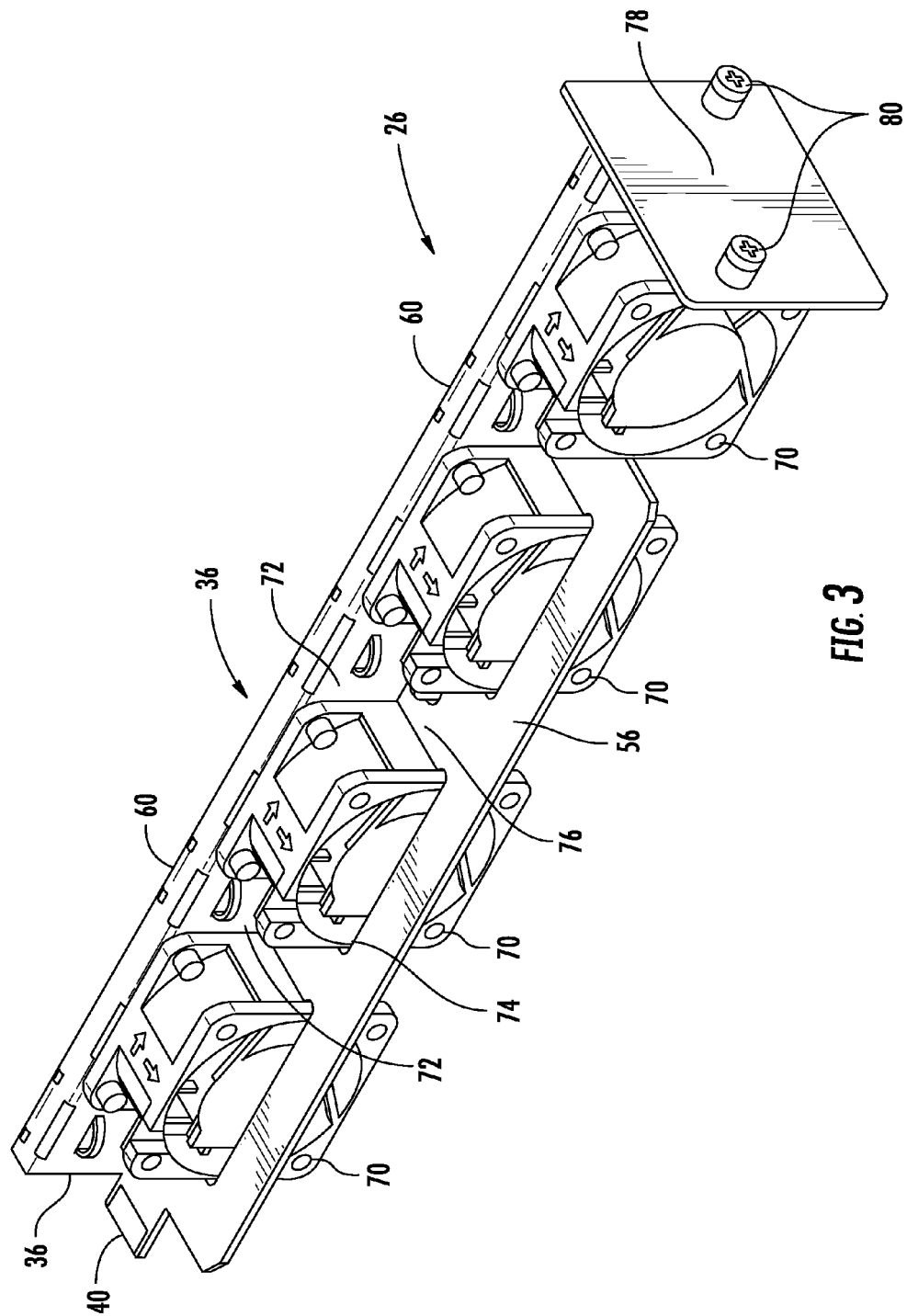
FIG. 3 is an enlarged isometric view of the fan shelf module shown in FIGS. 1 and 2 in accordance with a non-limiting example.

FIG. 3 shows details of the fan shelf module 26 and illustrates that the fan shelf module includes a fan frame 36 that supports a pinout connector 40 lying along a vertical or horizontal line of symmetry and configured to engage an interface connector 42 that is positioned within the chassis 22 and configured to provide power. In examples shown in FIGS. 1 and 2, the interface connector 42 is positioned near the end wall 23a of the enclosure that receives the fan shelf module and on the interior side wall 23c and connects to a source of power 44. As illustrated in FIGS. 1 and 2, the fan shelf module receives power through the interface connector 42. The chassis 22 includes a fixed module frame 50 in the example shown in FIGS. 1 and 2 that has a receiving slot 52 and a guide edge 54 that runs along the top. The fan frame 36 includes a longitudinal fan shelf tab 56 that is configured to be received within the receiving slot 52 when the fan shelf module is installed in a first direction such as shown in FIG. 1. A support track 60 (FIG. 2) of the fan frame is configured to be received over the guide edge 54 when the fan shelf module is installed in the opposing or reverse direction as shown in FIG. 2 and reverse from the direction as shown in FIG. 1. This configuration using the receiving slot 52 and guide edge 54 on the fixed module frame 50 within the chassis that interoperate with the fan shelf tab 56 and support track 60 permits the fan shelf module to be selectively installed in one of two opposing directions, allowing a fan air flow direction through the chassis to be selected as either pulling air through the enclosure as shown in FIG. 2 or pushing air within the enclosure as shown in FIG. 1.

FIG. 3 shows a plurality of serially connected fans 70 that are secured within the fan shelf module and secured to a vertical partition member 72 that forms the fan frame 36. The fan shelf tab 56 is formed as a horizontally extending rail on which one end includes the pinout connector 40, which in this example lies along a horizontal line of symmetry and is configured to engage the interface connector 42 and receive power therefrom. In this example, the fan shelf tab 56 is a planar configured member that includes rectangular cut-outs 74 that form support legs 76 that engage the fan frame and permit the fans to be received therein. In this example, four fans 70 are illustrated, but different numbers could be supported depending on the configuration and design.

The fan shelf tab 56 is received within the receiving slot 52 when the fan shelf module is installed in the first direction as shown in FIG. 1. In another example, the support track 60 is configured to be received over the guide edge 54 that extends along the top of the fan frame 36.

Figure 4:
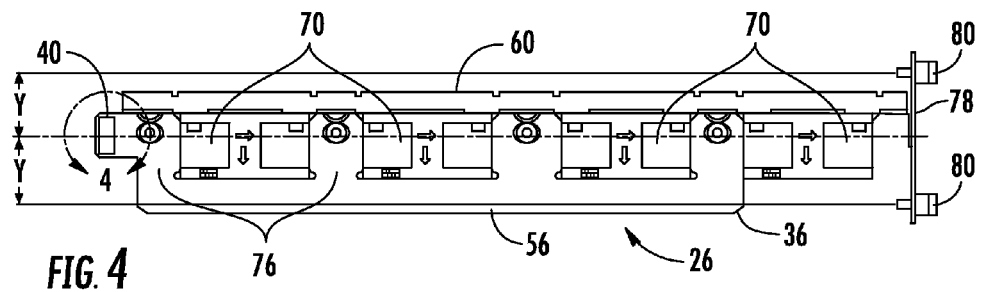
FIG. 4 is a top plan view of the fan shelf module in accordance with a non-limiting example.
Figure 5:
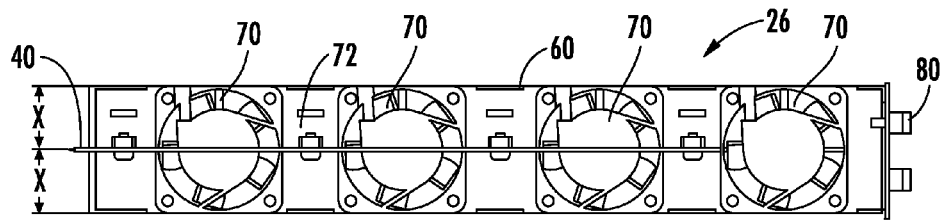
FIG. 5 is a rear elevation view of the fan shelf module in accordance with a non-limiting example.
Figure 6:
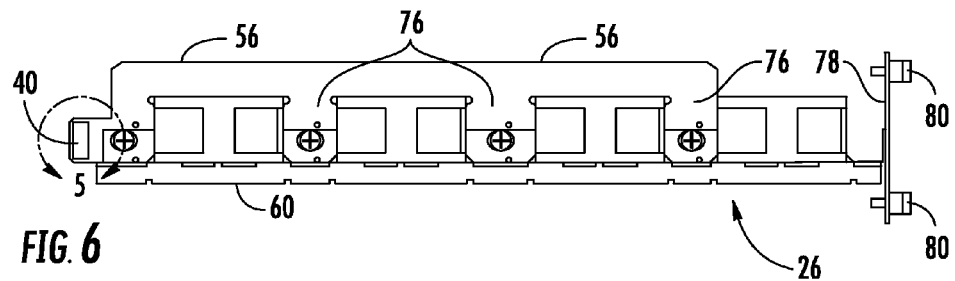
FIG. 6 is a bottom plan view of the fan shelf module in accordance with a non-limiting example.
Figure 7:
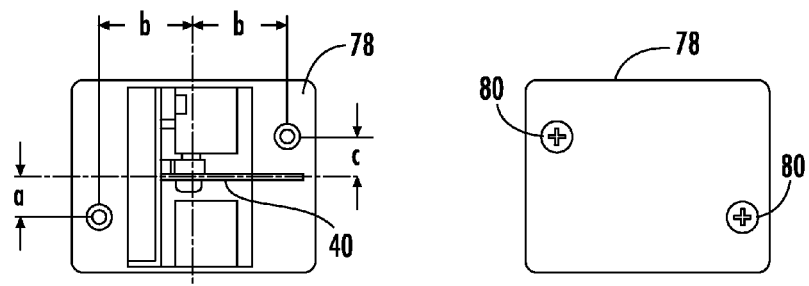
FIG. 7 is a left side elevation view of the fan shelf module in accordance with a non-limiting example.
Figure 8:
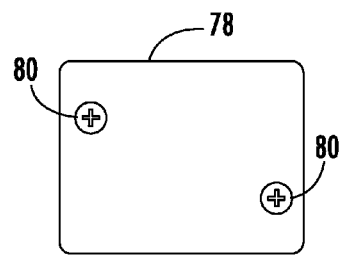
FIG. 8 is a right side elevation view of the fan shelf module in accordance with a non-limiting example.

FIG. 8 shows the right side elevation view of the fan shelf module and FIG. 7 shows the left side elevation view and showing the configuration of the pinout connector. As shown in FIGS. 4 and 5, an end support tab 78 is retained on the fan frame by attachment members such as screws 80 and acts as a frame support member.

Figure 9:
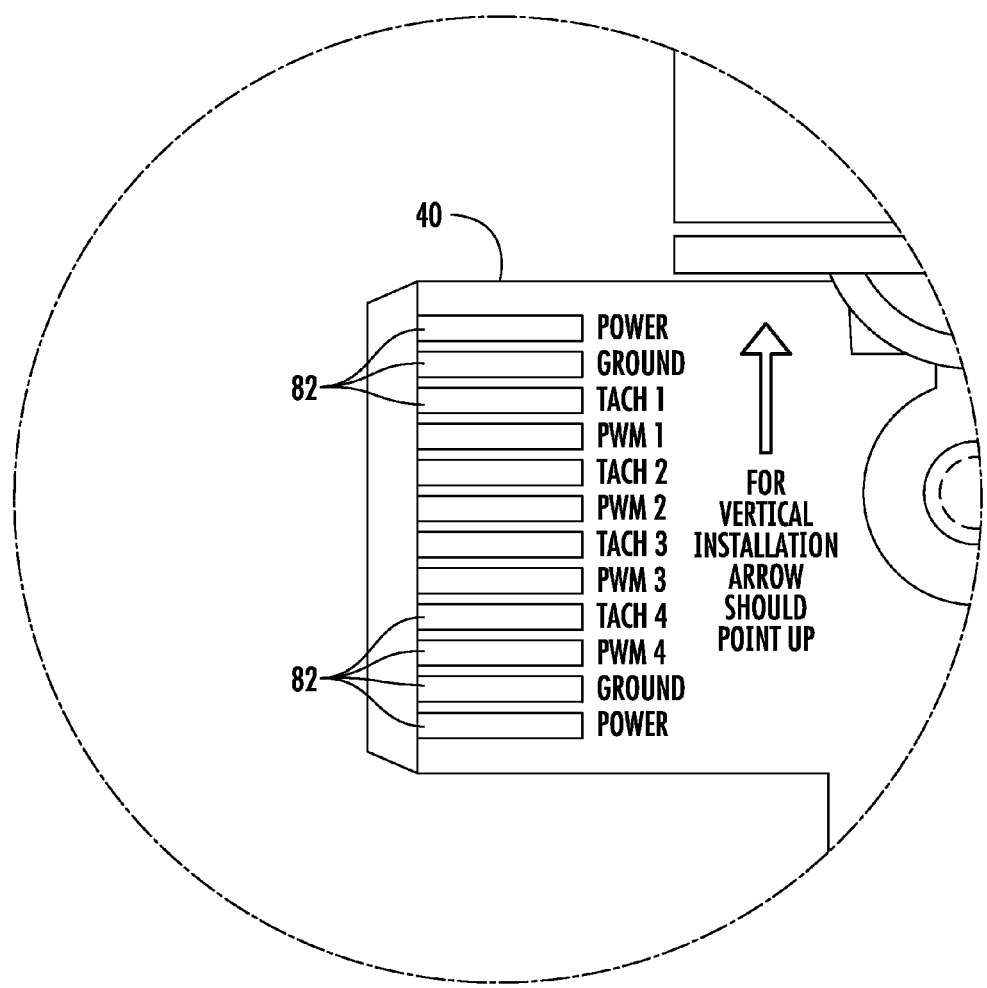
FIG. 9 is an enlarged view of the pinout connector shown in FIG. 4 in accordance with a non-limiting example.
Figure 10:
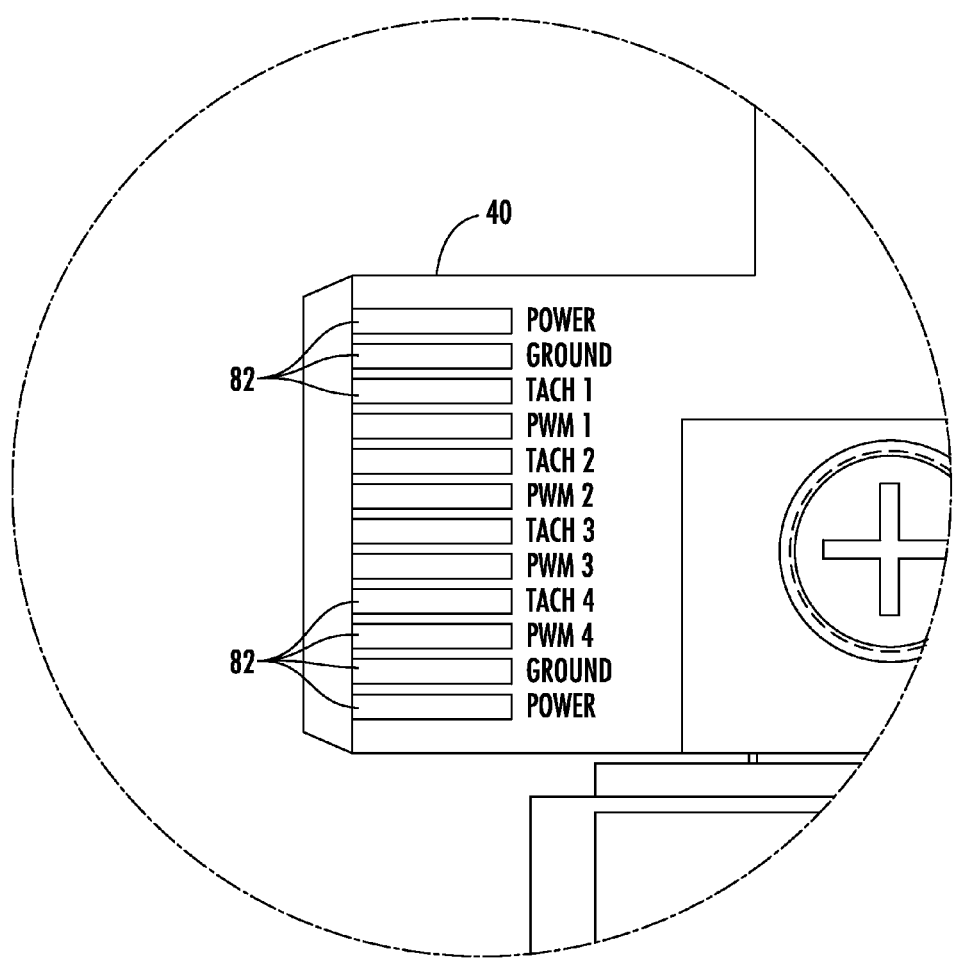
FIG. 10 is an enlarged view of the pinout connector shown in FIG. 6 in accordance with a non-limiting example.

FIG. 9 is an enlarged view of the pinout connector 40 as a top plan view and FIG. 10 is an enlarged view of the pinout connector 40 as a bottom plan view. These views show that the pinout connector 40 lies along a horizontal line of symmetry in this example and is formed as a planar configured tab that has electrical terminals 82 that are symmetrically arranged on top and bottom as shown in the views of FIGS. 9 and 10, allowing the pinout connector to be received within the interface connector in either opposing direction and permitting power to be drawn therefrom. The symmetrically arranged electrical terminals comprise dual ground and power terminals on the edges and symmetrically arranged the same distance from a center line of axes defined by the medial portion of the interface connector such that no matter the orientation, the fan shelf module receives power therefrom. In one example as shown in FIG. 9, a label is placed on the pinout connector that is formed similar to a card with an arrow indicating which direction for a vertical installation. The symmetry on the labeling is shown reading downward as F, G, T1, F1 . . . and reading upward from the bottom as F, G, F4, T4. The arrow and label ensures that when the fan is inserted into a vertical arrangement, there is a way to make sure the fan is assisting rather than fighting natural air flow. As illustrated in FIGS. 9 and 10, not only are dual ground and dual power terminals provided, but also tachometer and PWM terminals.

The various components for the enclosure and fan shelf module can be made from standard sheet metal that is stamped or formed to the appropriate configuration as shown in FIGS. 1-10.

FIG. 4 shows dimensions Y from the centerline to the retaining screws on the right support baffle. Dimension Y in one example is 0.820 inches, but can vary depending on the particular design. This dimension Y is only given as a non-limiting example to show a particular configuration. Dimension X in FIG. 5 for the height is about 0.787 in a non-limiting example.

In FIG. 7, dimension a is about 0.350 inches and dimension b is about 0.820 inches corresponding to dimension Y in FIG. 4. Dimension c is about 0.350 inches in that non-limiting example to show a symmetric fan module design.

It should be understood that a secondary solution is to have two receiving connectors mounted to alternate sides of a circuit board on the equipment the fan shelf is installed into, which has an offset around the center axis. This is a flexible option, but requires two receiving connectors on a board instead of one and is not as preferred. In some fan designs, the bias voltage on the fan could be reversed to reverse the flow, but most newer fans, however, have polarity protection and fan blade shapes that obviate this as an option.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An enclosure for electronics, comprising;
a chassis;
an interface connector positioned within said chassis and configured to provide power; and
a fan shelf module received within the chassis and having at least one fan to provide airflow through the chassis, wherein said fan shelf module comprises a pinout connector lying along a horizontal or vertical line of symmetry and configured to engage said interface connector and receive power therefrom such that the fan shelf module can be selectively installed in one of two opposing directions allowing a fan air flow direction through the chassis to be selected as either pulling air or pushing air through the chassis depending on the installed direction of the fan shelf module.

2. The enclosure according to claim 1, wherein said chassis comprises a one rack-unit height.

3. The enclosure according to claim 1, wherein said fan shelf module comprises a plurality of serially mounted fans.

4. The enclosure according to claim 1, wherein said pinout connector comprises a planar configured tab having electrical terminals that are symmetrically arranged on top and bottom allowing the pinout connector to be received within said interface connector in either opposing directions and permitting power to be drawn therefrom.

5. The enclosure according to claim 4, wherein said symmetrically arranged electrical terminals comprise dual ground and power terminals.

6. The enclosure according to claim 1, and further comprising a plurality of electronic shelf modules received within said enclosure and configured to receive electronic components and to receive the airflow created by the fan shelf module.

7. The enclosure according to claim 6, wherein said electronic shelf modules comprise vertical partition members spaced parallel from each other and each configured to receive and support electronic modules.

8. The enclosure according to claim 7, wherein said enclosure is substantially rectangular configured and includes an end that receives the fan shelf module, and said plurality of electronic shelf modules are received in parallel to each other and to the fan shelf module.

9. The enclosure according to claim 1, wherein said enclosure comprises a pizza box type enclosure.

10. An enclosure for electronics, comprising;
a chassis that includes a fixed module frame having a receiving slot and a guide edge;
an interface connector positioned within said chassis and configured to provide power; and
a fan shelf module comprising a fan frame received within the chassis and having at least one fan to provide airflow through the chassis, wherein said fan shelf module comprises a pinout connector lying along a horizontal or vertical line of symmetry and configured to engage said interface connector and receive power therefrom such that the fan shelf module can be selectively installed in one of two opposing directions allowing a fan air flow direction through the chassis to be selected as either pulling air or pushing air through the chassis depending on the installed direction of the fan shelf module, and said fan frame comprises a longitudinal fan shelf tab that is configured to be received within said receiving slot when the fan shelf module is installed in a first direction and a support track that is configured to be received over the guide edge when the fan shelf module is installed in the opposing direction.

11. The enclosure according to claim 10, wherein said chassis comprises a one rack-unit height.

12. The enclosure according to claim 10, wherein said fan shelf module comprises a plurality of serially mounted fans.

13. The enclosure according to claim 10, wherein said pinout connector comprises a planar configured tab having electrical terminals that are symmetrically arranged on top and bottom allowing the pinout connector to be received within said interface connector in either opposing directions and permitting power to be drawn therefrom.

14. The enclosure according to claim 13, wherein said symmetrically arranged electrical terminals comprise dual ground and power terminals.

15. The enclosure according to claim 10, and further comprising a plurality of electronic shelf modules received within said enclosure and arranged to receive the airflow created by fan shelf module.

16. The enclosure according to claim 10, wherein said electronic shelf modules comprise vertical partition members spaced parallel from each other and each configured to receive and support electronic modules.

17. The enclosure according to claim 10, wherein said enclosure is substantially rectangular configured and includes an end that receives the fan shelf module, and said plurality of electronic shelf modules are received in parallel to each other and to the fan shelf module.

18. The enclosure according to claim 10, wherein said enclosure comprises a pizza box type enclosure.

19. A method of providing an airflow through an enclosure for electronics, comprising:
providing a chassis and an interface connector within said chassis and configured to provide power; and
selectively installing a fan shelf module within the chassis and having at least one fan to provide airflow through the chassis, wherein said fan shelf module comprises a pinout connector lying along a horizontal or vertical line of symmetry and engaging the interface connector with the pinout connector and receiving power therefrom, and selectively installing the fan shelf module in one of two opposing directions allowing a fan air flow direction through the chassis to be selected as either pulling air or pushing air through the chassis dependent on the installed direction of the fan shelf module.

20. The method according to claim 19, wherein said chassis includes a fixed module frame having a receiving slot and a guide edge and the fan shelf module includes a fan shelf tab and a support track, and further comprising installing the fan shelf module within a first direction by sliding the fan shelf tab within the receiving slot and providing air flow in a first direction and installing the fan shelf module within a second opposing direction by reversing orientation of the fan shelf module and sliding the support track over the guide edge and providing air flow in reverse direction.

21. The method according to claim 19, and further comprising forming the chassis as a one rack-unit height.

22. The method according to claim 19, and further comprising forming the module as a plurality of serially mounted fans.

23. The method according to claim 19, and further comprising forming the pinout connector as a planar configured tab having electrical terminals that are symmetrically arranged on top and bottom and receiving the pinout connector within the interface connector in either opposing directions and drawing power therefrom.

24. The method according to claim 23, and further comprising forming the symmetrically arranged electrical terminals as dual ground and power terminals.

25. The method according to claim 19, and further comprising receiving a plurality of electronic shelf modules within said enclosure and arranged to receive the airflow created by fan shelf module.

26. The method according to claim 25, and further comprising forming electronic shelf modules as vertical partition members spaced parallel from each other and each configured to receive and support electronic modules.

27. The method according to claim 26, and further comprising forming the enclosure as substantially rectangular configured and including an end that receives the fan shelf module, and receiving the plurality of electronic shelf modules in parallel to each other and to the fan shelf module.

28. The method according to claim 19, and further comprising forming the enclosure as a pizza box type enclosure.

* * * * *